United States Patent [19]
Horine et al.

[11] Patent Number: 5,515,604
[45] Date of Patent: May 14, 1996

[54] METHODS FOR MAKING HIGH-DENSITY/LONG-VIA LAMINATED CONNECTORS

[75] Inventors: David A. Horine, Los Altos; David G. Love, Pleasanton, both of Calif.

[73] Assignee: Fujitsu Limited, Kanagawa, Japan

[21] Appl. No.: 134,374

[22] Filed: Oct. 12, 1993

Related U.S. Application Data

[63] Continuation-in-part of Ser. No. 957,712, Oct. 7, 1992, abandoned.

[51] Int. Cl.$^6$ ............................................. H05K 3/36
[52] U.S. Cl. .................................. 29/830; 29/846; 29/885
[58] Field of Search ............................ 29/830, 840, 846, 29/884, 885; 427/96; 228/180.22; 439/66, 91, 633

[56] References Cited

U.S. PATENT DOCUMENTS

| | | | |
|---|---|---|---|
| 3,986,255 | 10/1976 | Mandal | 29/840 |
| 3,998,513 | 12/1976 | Kobayashi et al. | 439/91 |
| 4,182,781 | 1/1980 | Hooper et al. | |
| 4,202,007 | 5/1980 | Dougherty et al. | |
| 4,503,131 | 3/1985 | Baudrand | |
| 4,824,693 | 4/1989 | Schlipf et al. | |
| 4,926,549 | 5/1990 | Yoshizawa et al. | 439/66 |
| 5,017,516 | 5/1991 | van der Putten | |
| 5,071,359 | 12/1991 | Arnio et al. | 439/91 |
| 5,107,586 | 4/1992 | Eichelberger et al. | 29/840 |
| 5,130,275 | 7/1992 | Dion | 228/180.22 |

FOREIGN PATENT DOCUMENTS

| | | | |
|---|---|---|---|
| 932877 | 8/1973 | Canada | 29/840 |
| 168790 | 6/1992 | Japan | 29/840 |

OTHER PUBLICATIONS

IBM Technical Disclosure Bulletin, Flexible Tape Conductor Interconnection for Chips, Auletta and Marks, vol. 24, No. 2, Jul. 1981.

Technical Data Sheets for the Shin-Flex™ "S-Connector, SS-Connector, SG-Connector, H-Connector", and the AF-Connector, Shin-Etsu Polymer, 1987.

Technical Data Sheet for the "TECKNIT® Zebra Layered Elastomeric Connecotr Elements," TECKNIT®, Apr. 1977.

Technical Data Sheets for the "Carbon Stax Elastomeric Connectors," Silver Stax Elastomeric Connectors, and Moe Elastomeric Connectors, Pckelastomerics, Inc., dates unknown.

*Primary Examiner*—David P. Bryant
*Attorney, Agent, or Firm*—Coudert Brothers

[57] ABSTRACT

A high-density laminated connector having a plurality of rigid dielectric layers laminated together is described. The rigid construction of the connector permits precise dimensions of the connector and, thus, accurate attachment of adjacent interconnect substrates. The dielectric layers include traces which have contact pads or bumps formed at the surfaces of the connector for connection to the traces of one or more adjacent interconnect substrates. The contact pads may comprise soft gold, solder, or various elastomeric materials. The use of soft gold contacts enables the connector to be easily removed from an adjacent interconnect substrate. In other embodiments, the rigid dielectric layers may comprise recesses where the contact pads are placed. This ensures physical alignment of the interconnect substrate and the connector, so that dimensional integrity is maintained when pressure is applied to the connector. The traces within the connector can be of a varied width, pitch, and direction. Thus, right-angle interconnections can be made. Cross-traces can be placed on each individual layer of dielectric and vias made through the dielectric layers to interconnect traces. The trace width can be economically and accurately narrowed to produce high aspect ratios and thus provide high signal density.

29 Claims, 5 Drawing Sheets

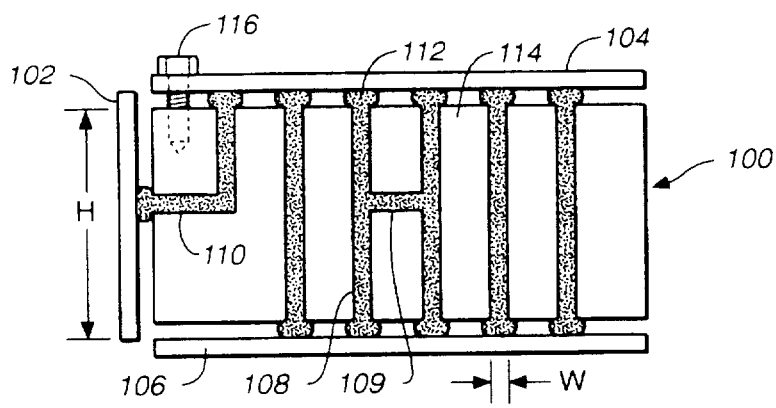
FIG._1
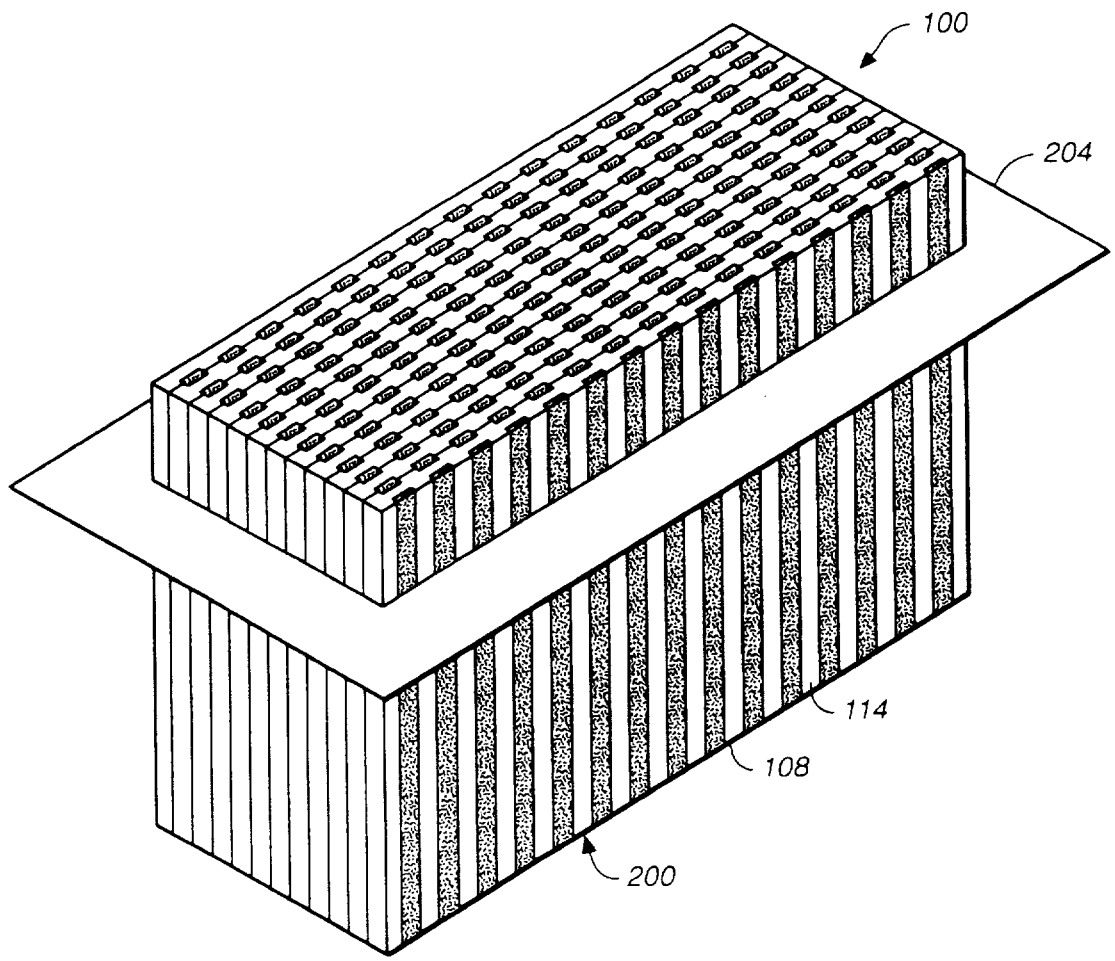
FIG._2

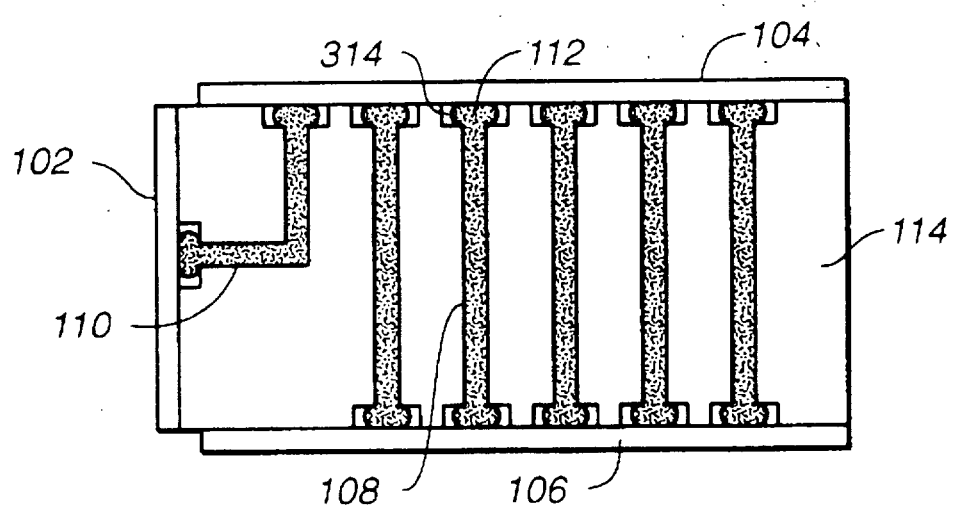
FIG._3
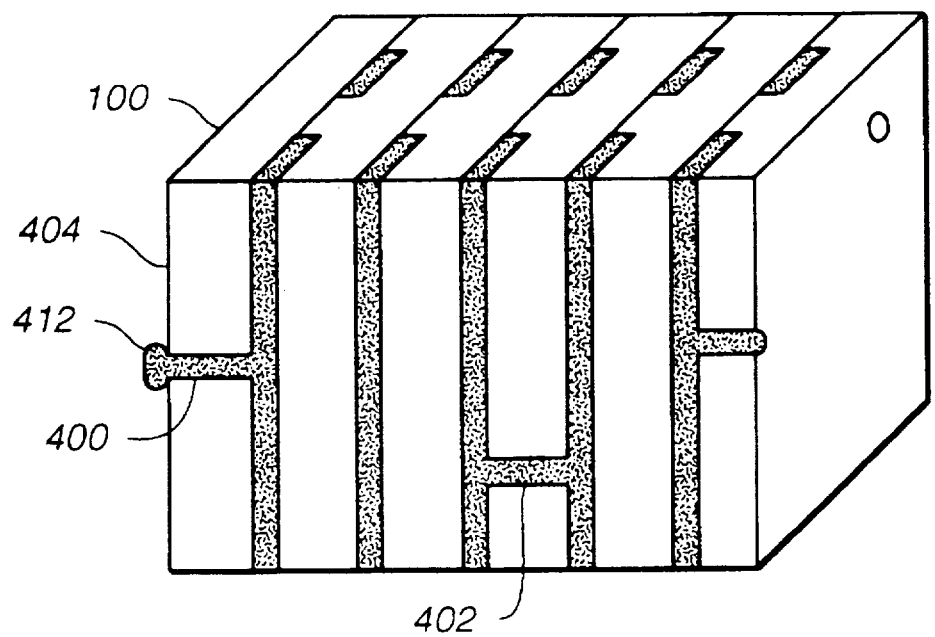
FIG._4

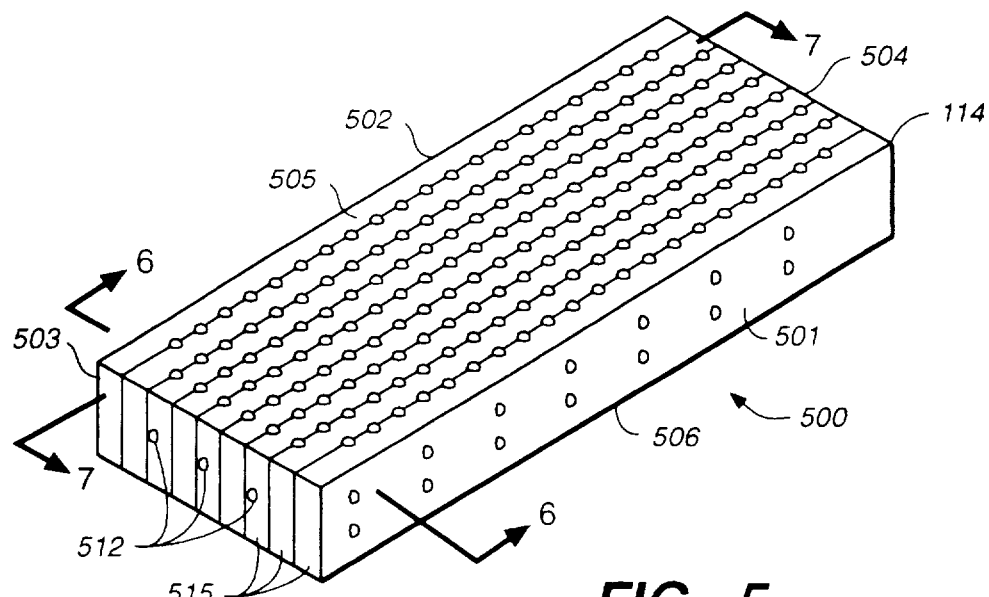
FIG._5
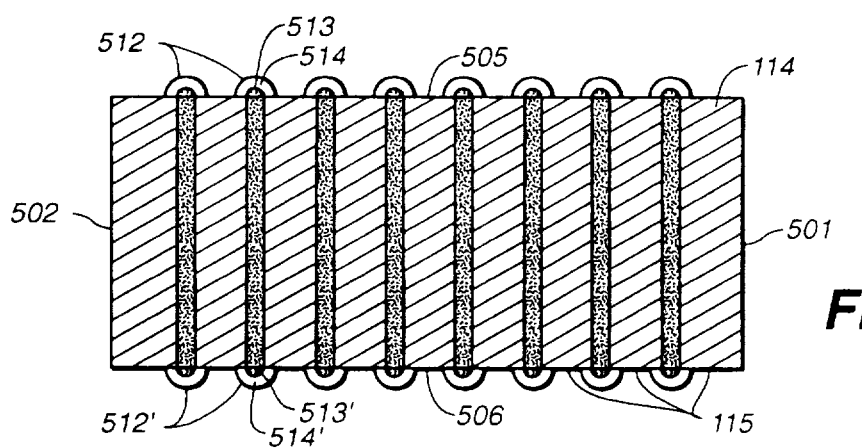
FIG._6
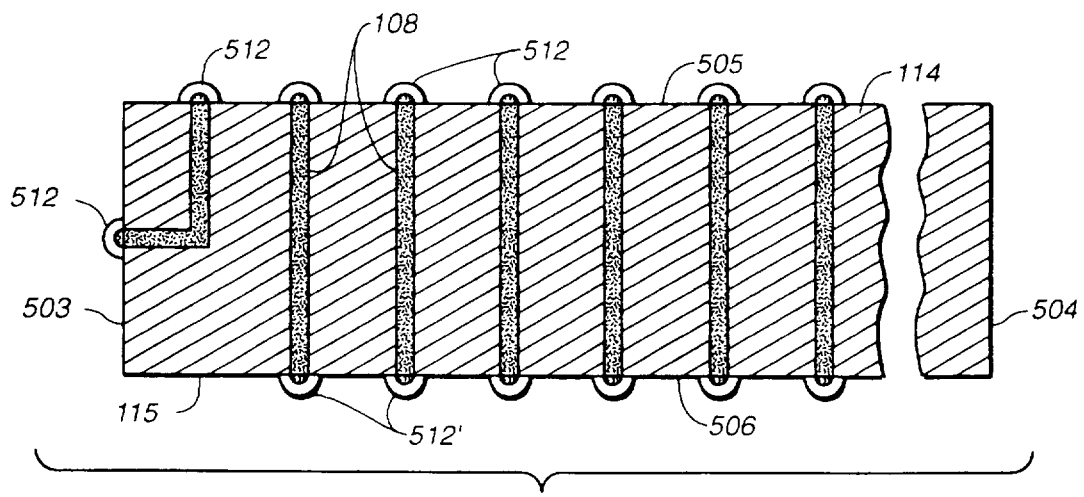
FIG._7

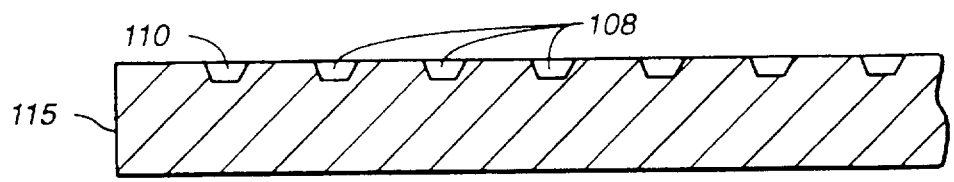
FIG._8
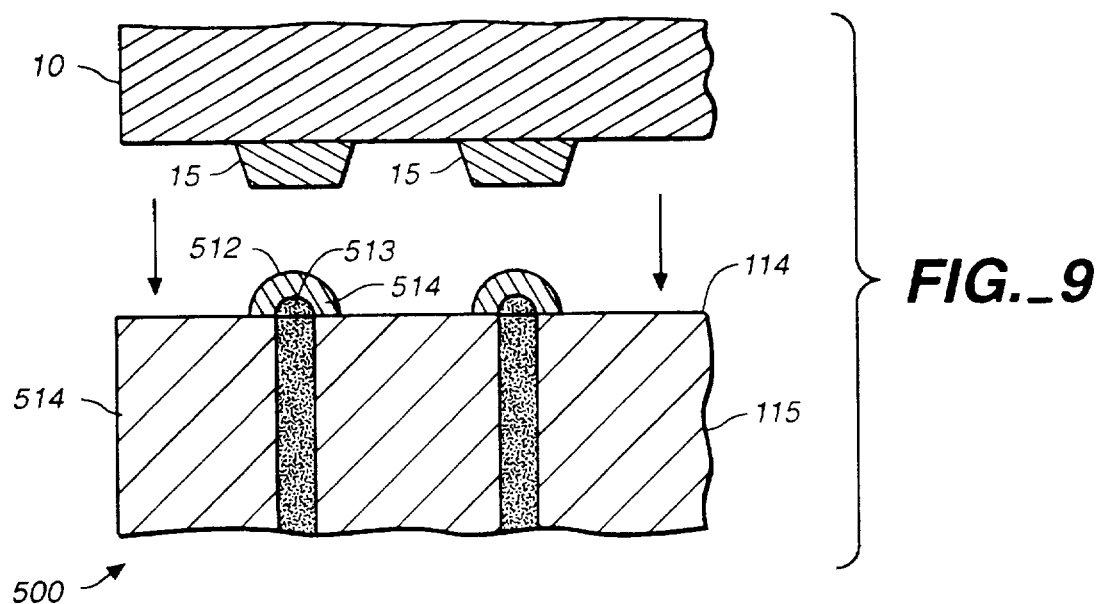
FIG._9
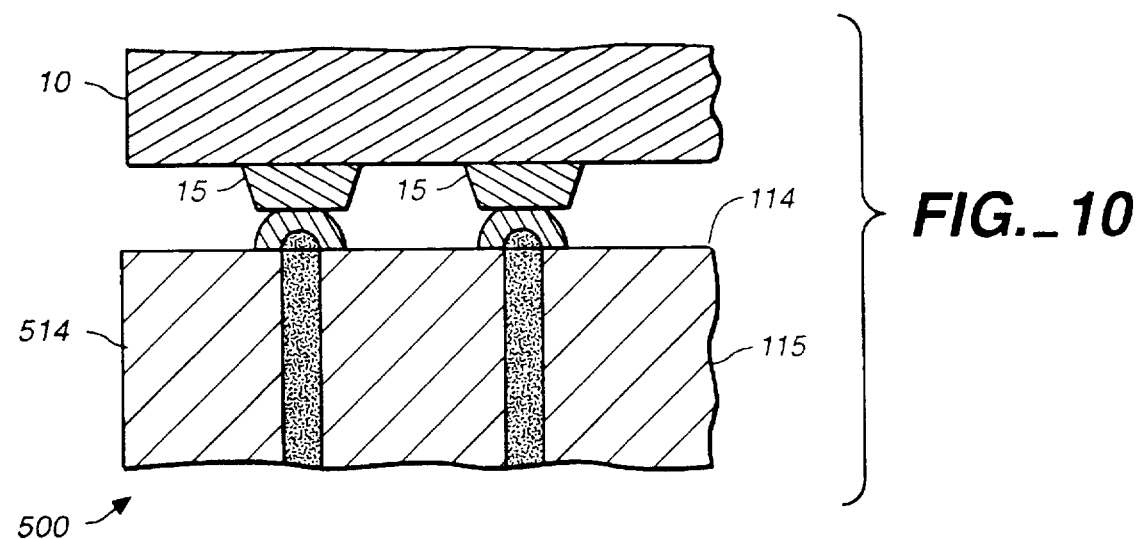
FIG._10

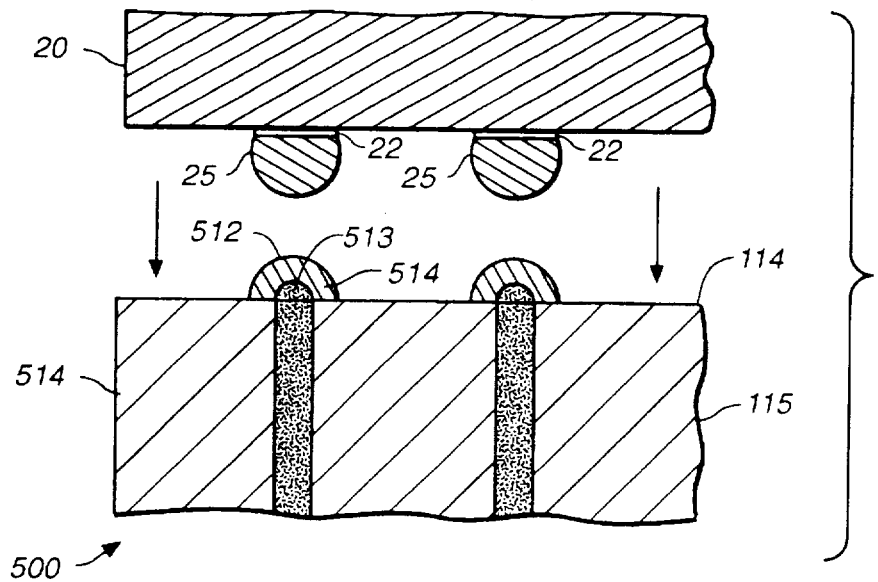
FIG._11
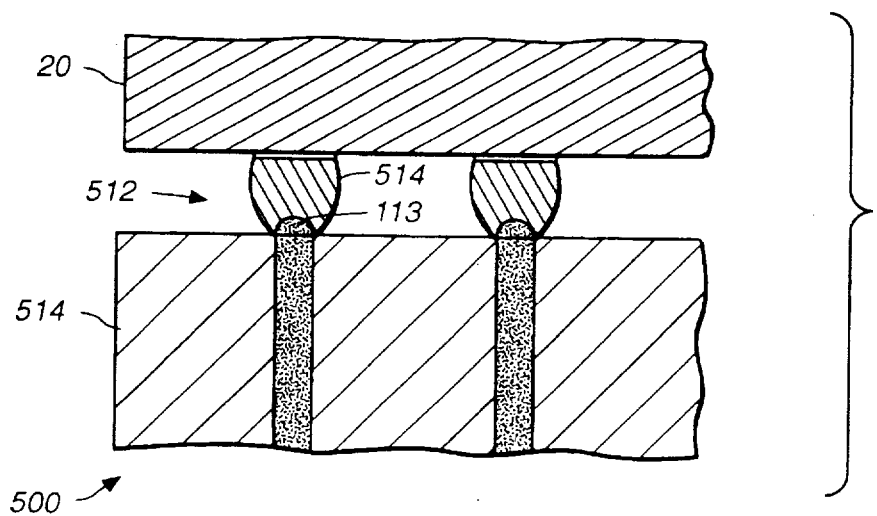
FIG._12

METHODS FOR MAKING HIGH-DENSITY/LONG-VIA LAMINATED CONNECTORS

This application is a continuation-in-part of U.S. patent application No. 07/957,712, filed Oct. 7, 1992 for HIGH-DENSITY/LONG-VIA LAMINATED CONNECTOR, now abandoned.

FIELD OF THE INVENTION

The present invention relates generally to the interconnection of electrical power and signals between multi-chip modules, circuit boards, and the like. In particular, the present invention relates to electrical connectors for interconnecting electrical signals between multi-chip modules and circuit boards, and to various methods of forming such connectors.

BACKGROUND OF THE INVENTION

Mid-range and high performance computer systems comprise hundreds to thousands of integrated circuit (IC) chips and employ a variety of ways of interconnecting the IC chips. These systems also employ various types of interconnect substrates, such as for example, printed circuit boards and cards, and interconnect substrates of multi-chip modules.

In one interconnect approach, the IC chips are packaged in individual carriers and are distributed on a number of printed-circuit-board (PCB) cards, with each card being "plugged" into a main interconnect PCB board through a card-to-board connector. Each PCB card includes interconnecting electrical traces, or lines, which route electrical power to the IC chips, and which also route electrical signals between the card's IC chips and between the IC chips and the main interconnect board. A card-to-board connector may comprise a conventional leaf-spring tab connector, a zero-insertion-force (ZIF) connector, or a conductive elastomer connector compressed between the components. Alternatively, the connector may be eliminated and the traces on PCB card formed to enable direct soldering to corresponding traces on the main interconnect board.

In another approach, the IC chips are distributed on a plurality of multi-chip modules and mounted thereto without individual chip packaging. Each module in turn is "plugged" onto a main interconnect board, forming a two-dimensional array with the other modules. Each multi-chip module comprises an interconnect substrate having two or more integrated circuit (IC) chips directly mounted thereto. A plurality of interconnect traces are formed in the module's substrate. There may be several thousand or more interconnect traces in a module. Some of the traces route power to the module's IC chips, while other traces route electrical signals between the module's IC chips. Still other traces carry electrical signals to other modules and input and output (I/O) signals to the system by way of the main interconnect board. In general, electrical signals propagate at higher speeds in the multichip modules than in the main interconnect board or in the PCB cards of the first approach.

A third approach distributes individually packaged IC chips on a number of like PCB cards which are stacked upon one another to form a three-dimensional chip array. Electrical power is fed to one face of the array, and system input/output (I/O) signals are fed to another face. A number of inter-layer interconnections extend vertically through the stacked PCB cards to couple electrical signals between the PCB cards. Currently, there is an interest in exploring ways in which this configuration might be applied to multi-chip modules.

In comparison to personal computers and workstations, high-performance computer systems employing the above approaches have relatively high numbers of signal connections between their PCB cards or modules and their main interconnect boards. Approximately 1,800 and more connections per board or module are typical in current products. In order to reduce the transit times of electrical signals and increase computation rates, current trends in the industry are to increase the number of these connections beyond present levels and to shrink the size of the cards, boards, and modules. Satisfying both of these trends will require a very large increase in the density of the connections. For the next generation of high-performance computers, it is expected that the connection density for two-dimensional multichip modules will have to increase two to four times from present levels of 30 to 60 connections per square centimeter of the module's connecting face. Of course, as the connection density increases, the connections themselves will need to have more precise dimensions and better alignment to corresponding connections. In turn, the modules, cards and boards will also need to have more precise dimensions and better alignment to mating components. As an economic matter, the increase in connection density will have to be achieved without substantial increases in manufacturing costs or in manufacturing complexity, the latter of which may adversely impact on the yield of modules, cards, boards, and connectors.

Unfortunately, there are a number of barriers which hinder achieving increased connection densities, more precise dimensions of the connections, and better alignments of the connections. The electrical traces formed through many multichip modules, cards, boards, and connectors currently have relatively narrow widths in comparison to their lengths, and accordingly have what will be referred to herein as high aspect ratios, which is defined as the ratio of the length of a trace divided by its average width. The traces are typically formed by punching, drilling, or molding, each of which uses a hole-forming tool having relatively narrow width in comparison to its length. Increasing the connection density will require decreasing the widths of the traces, which leads to increased aspect ratios for those traces whose lengths are not commensurately decreased. Unfortunately, it becomes more difficult to form the traces as the aspect ratio increases because the increased aspect ratio of the hole-forming tool causes the tool to become more prone to deflecting off course during the formation process, causing misalignment of the trace, unwanted merging of traces, or breakage of the tool inside the card, board, or module. Typically, conventional connectors are limited to trace aspect ratios of approximately 20 or less.

Furthermore, in those cases where card-to-board connectors are used to couple various components, it becomes more difficult to manufacture the connectors with precise dimensions and to connect them to their respective components as the connection density increases simply because the sizes of the connector's electrical parts (e.g., leaf springs and pins) decrease. It is also more difficult to align the card-to-board connectors, as many of these connectors have interconnecting parts which are not sufficiently rigid and may therefore move (e.g., leaf spring tabs, elastomer connectors). This movement, particularly in rubber elastomer connectors, can result in incorrect placement of mating circuit boards, either initially or over time due to vibrations, contact forces, or stresses caused by thermal expansion and contraction. Some connectors simply lack the rigidity needed to maintain the dimensional integrity required for the high density of connections.

Accordingly, there is a need for connectors having precise dimensions and trace placements so as to ensure accurate interconnection of traces among interconnect substrates (e.g., cards, boards, and module substrates). Additionally, connectors having traces with high aspect ratios formed without complex or costly manufacturing processes are desirable. It would further be advantageous to have card-to-board connectors, board-to-board connectors, and main interconnect boards for multichip modules which can employ various connection schemes, particularly ones which would permit easy configuration changes.

SUMMARY OF THE INVENTION

The present invention encompasses a solid array connector capable of providing a high density of high-aspect ratio electrical traces, and capable of being used as a connector for interconnect substrates (e.g., PCB cards and boards, multichip module substrates, and the like). The solid array connector is further capable of being used as an inter-layer connector in three-dimensional arrays of IC chips and other related uses where there is a need for rigid electrical traces having extremely high aspect ratios and precise location of their terminal ends (e.g., connection contacts). The present invention further encompasses methods for manufacturing such solid array connectors with relatively low complexity and cost.

Broadly stated, the solid array connector according to the present invention comprises a plurality of precisely-formed layers of dielectric material laminated together to form a connection block. The connection block has top and bottom faces at the exposed surfaces of the top and bottom laminated layers, respectively, and a number of side faces at the edges of the laminated layers. In one embodiment, the block has four side faces, for a total of six faces, and has a parallelepiped shape. A plurality of electrical traces are formed on selected ones of the laminated layers. In one embodiment, one or more traces are formed on each layer. Preferred embodiments of the present invention employ rigid dielectric materials which enable precise tolerances and pressure contacts while maintaining dimensional integrity.

The traces can be of varied width and direction. In one embodiment, the traces are precisely imaged on the lamination layers by silk screening with a metal paste. In another embodiment, channels are etched in the dielectric with photolithographic techniques, and a conductor is sputtered into the channels. After being laminated, the block is precision-cut along at least two different planes to expose ends of the traces. The traces may be connected to an interconnect substrate (or connector) with the use of contacts comprising gold, solder, or a conductive elastomeric material. The contacts are positioned at trace terminals on the precision-cut surfaces, which may include all faces of the connector, such as for example all six faces of a parallelepiped-shaped connection block. Traces and cross-traces within the laminated layers enable connections to be made at the side faces of the solid array connector, and interconnecting traces to be formed among the side faces. Vias formed transverse to the layers enable the formation of connections at the top and bottom faces of the solid array connector, the formation of electrical traces between the top/bottom faces and the side faces of the solid array connector, and the interconnection of traces in different layers.

In a further embodiment of the present invention, recesses are formed in the faces of the solid array connector at the terminals of the traces where the contact pads are placed. This ensures rigid mechanical connection between the connector and the interconnect substrates (e.g., boards, card, module substrates). The precise tolerances of the mating surfaces on the solid array connector permit accurate placement of the interconnect substrates adjacent to the solid array connector. Narrow traces can be formed on the individual layers which permits substantially high aspect ratios.

In the present invention, the ends of the traces may be spaced extremely close to one another, making the size of the contact pads and bumps and/or the spacing distances therebetween relatively small. Unfortunately, the types of photolithographic and pattern transfer equipment which can readily define small contact features are designed for processing thin wafers, not solid array connectors (which may have shapes very different from thin wafers). Accordingly, the present invention further encompasses novel methods of forming contact pads and bumps on the ends of the electrical traces without the need for photolithographic and pattern transfer process or equipment.

Broadly stated, these methods comprise electroplating conductive materials onto the ends of traces formed at two or more selected faces of the solid array connector such that conductive contact bumps having dimensional integrity are formed thereat. Preferred methods subsequently form layers of solder or pliable conductive materials over the contact bumps at one or more of the selected faces by electroplating or dipping in a bath of molten material. When different layer materials are required to be formed on different faces, blanket masks may be selectively applied to faces. With these methods, contact pads and bumps may be readily manufactured without the need for photolithography, pattern transfer processes, or steps requiring precision alignment. These methods may be applied to solid array connectors according to the present invention as well as other types of connectors.

Accordingly, it is an object of the present invention to enable extremely high densities of connections and interconnecting electrical traces in connectors for interconnect substrates, such as multichip modules, PCB cards, PCB boards, and the like.

It is another object of the present invention to enable electrical traces with virtually unlimited aspect ratios.

It is yet another object of the present invention to enable angled interconnections within connectors which may be easily formed.

It is still another object of the present invention to provide connectors which maintain their dimensional integrity in response to various applied forces and stresses.

It is a further object of the present invention to provide connectors which may be easily removed from their interconnect substrates and reconfigured.

It is yet another object of the present invention to provide the above capabilities without substantially increasing manufacturing complexity or costs.

It is still another object of the present invention to provide a method of forming contact pads and bumps on the ends of electrical traces of a connector without the use of photolithographic or pattern transfer processing steps.

It is a further object of the present invention to provide a method of forming such contact pads and bumps on connectors having small dimensions.

These and other objects of the present invention will become apparent to those skilled in the art from the following detailed description of the invention, the accompanying drawings, and the appended claims.

BRIEF DESCRIPTION OF THE DRAWINGS

FIG. 1 is a partial side view of a solid array connector according to the present invention attached to three interconnect substrates;

FIG. 2 is an elevation of a connection block before being cut into individual solid array connectors;

FIG. 3 is a partial side view of a second embodiment of a solid array connector according to the present invention, demonstrating connection to adjacent interconnect substrates using a dielectric block with stop surfaces;

FIG. 4 is an isometric view of a solid array connector according to the present invention with vias interconnecting traces;

FIG. 5 shows an isometric view of another embodiment of the solid array connector according to the present invention;

FIG. 6 shows a first cross-sectional view of the solid array connector shown in FIG. 5 along a first plane indicated in FIG. 5;

FIG. 7 shows a second cross-sectional view of the solid array connector shown in FIG. 5 along a second plane indicated in FIG. 5;

FIG. 8 shows a cross-sectional view of a dielectric layer according to one embodiment of the present invention wherein the electrical traces are placed within trenches formed on a surface of the layer; the layer is shown before being laminated;

FIG. 9 shows a partial cross-sectional view of a solid array connector shown in FIGS. 5–7 opposite to an interconnect substrate prior to attachment by contact pressure.

FIG. 10 shows a partial cross-sectional view of the solid array connector and an interconnect substrate shown in FIG. 9 after attachment.

FIG. 11 shows a partial cross-sectional view of a solid array connector shown in FIGS. 5–7 opposite to an interconnect substrate prior to attachment by soldering.

FIG. 12 shows a partial cross-sectional view of the solid array connector and interconnect substrate shown in FIG. 11 after attachment.

DETAILED DESCRIPTION OF THE INVENTION

FIG. 1 shows a view of the top face of a laminated solid array connector 100, which is attached to three exemplary interconnect substrates 102, 4, and 106. The full length of the connector is not shown, so the connector's right side face is not visible. The laminated solid array connector comprises a plurality of layers of a rigid dielectric material containing electrical traces 108. In one embodiment, the dielectric comprises glass ceramic materials. In another embodiment, borosilicate glass is used. The dielectric constant for glass ceramic in the present embodiments of the invention is less than 5.7, and for glass, less than 5. It is preferred to use a material with a dielectric constant of less than 7.

The electrical traces 108, as shown in FIG. 1, are parallel to each other and of uniform dimensions. However, the traces in other embodiments are positioned in a multitude of directions and can have varying dimensions. The electrical trace 110, which is at a right angle to the other traces 108, demonstrates that the traces can be positioned in various locations. Thus, this invention allows both straight-through and right-angle interconnections.

The traces can be manufactured to a narrow width employing the present invention. In an exemplary embodiment, the trace width is 0.075 millimeter, which is narrower than the widths typically achieved by mechanical drilling. Thus, a high aspect ratio (the length of the trace divided by the trace width) is achieved by applying the traces on the individual layers before laminating the layers together. In one embodiment, an aspect ratio of 26 is achieved. However, the aspect ratio could be unlimited. In practical embodiments, aspect ratios in excess of 40 are feasible.

The electrical traces 108, at their terminals, have contact pads 112. The contact pads 112, which are generally ellipsoidal in shape and wider than the electrical traces, connect solid array connector 100 to the interconnect substrates 102, 104, and 106. Intralayer connections between traces are accomplished with cross-traces 109. In the embodiment shown in FIGS. 1, 3, and 4, the contact pads comprise soft gold, where electrical contact is produced by applying pressure on the interconnect substrate to urge it against connector 100. In a present embodiment of the invention, interconnect substrate 104 is attached to the connector 100 with the use of a screw 116. By removing the screw 116, the pressure placed on interconnect substrate 104 is removed. The capability to easily remove the interconnect substrates is useful where substrates have to be rearranged or taken out for testing.

In other embodiments, the contacts at one or more face(s) of solid array connector 100 comprise solder. The connector is electrically connected by solder to one of the interconnect substrates. Substrates attached to additional faces employ mechanical or solder connections. Two different solder materials may be used to attach separate interconnect substrates to the solid array connector. This enables removal of one substrate using one temperature to melt only one solder connection. These embodiments permit easy removal of one interconnect substrate for testing or configuration changes while leaving intact the attachment of the solid array connector to other substrates.

FIG. 2 shows a connection block 200 according to the present invention from which one or more solid array connectors 100 may be formed. Connection block 200 comprises a plurality of planar layers of the rigid dielectric material 114 laminated together. In one embodiment, block 200 may be manufactured by laminating together ceramic green sheets (i.e., layers). The green sheets are formed by wet-grinding fine-grained reactive oxides in ball mills which are also charged with deflocculents, binders, plasticizers, lubricants, grain growth inhibitors, and organic solvents. This slurry is spread on a carrier film of polyester or is spread on cellulose acetate. The film and slurry move at a constant speed under a metal knife so that a thin sheet of wet glass ceramic is formed. The glass ceramic sheet is air-dried to remove solvents and then cleaned to provide a smooth surface for printing purposes and to eliminate particles that would cause circuit interruptions.

The traces 108 are precisely formed by coating green sheets with copper paste or ink and are converted to conductors after firing of the green sheets. Resistor paste or other metals can also be applied to the layers of dielectric before or after firing.

The green sheets are then superimposed on each other and are adhered to each other by a hot isostatic press. Sufficient pressure is applied on the layers of green sheets to provided a unitary laminated block. The laminated block is then placed in a sintering oven for firing, at approximately 300° C. to 600° C., to remove organic binders, lubricants, plasticizers, and deflocculents. The green sheets are subsequently co-fired at higher temperatures of approximately 1000° C. in a nitrogen atmosphere. This causes simultaneous sintering of glass ceramic and copper metallization.

In other embodiments, the layers of dielectric in the block may comprise sapphire, glass, silicon, gallium arsenide, or quartz. Slabs of sapphire, glass, etc., which will comprise the dielectric layers of the connection block, are precision-ground and lapped to achieve desired tolerances for surface parallelism, flatness, and finish. For each dielectric layer which is to have traces, a photoresist material is applied to a finished surface of the layer. In the present embodiment, only one surface of the dielectric layer is coated; however, in other embodiments of the invention, both surfaces of the dielectric layer may be coated and processed for added signal density.

The photoresist is cured, traces are imaged, and photoresist is developed to create a pattern for etching of the dielectric layer using standard photolithographic techniques. Grooves are then etched in the dielectric corresponding to the imaged traces using an appropriate etchant.

After etching, the photoresist from the trace-imaging process is stripped, providing a clean surface on the dielectric layer. Metal for the traces is then plated or sputtered onto the dielectric layer, and subsequent photolithographic processing and etching of the plated dielectric layer are then accomplished to create metal-filled grooves in the dielectric layer. The dielectric layers are precisely aligned and bonded to form the connection block, as shown in FIG. 2. In a preferred embodiment where the dielectric layers comprise glass, diffusion bonding is employed. A combination of heat and pressure applied to the stacked layers results in joining together the layers. Exemplary diffusion bonding processes for silicon dielectrics provide for conditioning of the surface with sulfuric peroxide with application of pressure while heating the laminate to 500° C. to 600° C. Standard adhesives may be used in alternate embodiments where dimensional control may be relaxed, allowing for thickness variation in the bond layer.

The connector is cut from the block to precise dimensions by precision-sawing the laminated block and then polishing and lapping the surfaces of the connector. The connection block is cut along a horizontal plane 204, which is generally normal to the surfaces of the layers, exposing traces 108 of the laminated connector 100. The use of the rigid dielectric material permits the individual layers of dielectric material and the laminated connector 100 to be cut and lapped to very precise dimensions using existing processes. Tolerances on the order of one-quarter wavelength of light can be obtained (e.g., 125 nm). In one embodiment, the connector is approximately two millimeters high. The individual layers are approximately 0.16 millimeter thick.

FIG. 3 shows a second embodiment of the invention wherein contact pads 112 are recessed in the dielectric material 114. Mating surfaces surrounding the recesses are precision-machined to achieve high tolerances in the connection. The dielectric material 114 contains cylindrical recesses 314, where the contact pads 112 are placed. Interconnect substrate 104 is mounted onto the connector with a screw (not shown in FIG. 3), which urges the substrate into contact with the connector, compressing the contact pads 112. The screw extends into a tapped hole in the connector through an aperture in the substrate, as in the embodiment shown in FIG. 1. Other mechanical attachment means can also be employed. Precise controls on the depth of the recesses restrict the amount of compression of the contact pads. Consequently, there is a rigid mechanical connection between the interconnect substrates and the connector, and, therefore, dimensional integrity will be maintained when thermal stresses occur. Precision-machining of the recesses also assures that the compression on the contact pads stays within their elastic limit, providing more reliable and resilient contact pads.

FIG. 4 shows an internal via 402 which extends between adjacent layers of the connector to interconnect a trace 108 on one of the layers to a trace 108 on the other layer. FIG. 4 also shows an external via 400 which extends from a trace within the dielectric body through an end layer to the top (or bottom) face 404 of connector 100, and is joined to a contact pad 412 which will interface with an interconnect substrate. Vias 400 and 402 are generally orthogonal to the surfaces of the laminated layers, as shown in FIG. 4. However, the orthogonal orientation is not a limitation of the present invention and the vias may be formed at various angles to the layer surfaces. In one embodiment using glass, the vias are formed by laser-drilling holes and then plating metal into the holes. In another embodiment using green sheets, the vias are manufactured by such processes as laser-cutting, punching, or drilling a hole, and then pasting the conductive material through the hole during the prelamination processing previously described. Other processes, for example those using photolithography, may also be used.

As demonstrated in FIG. 3, the traces within each layer of the laminated connector enable connections (i.e., terminations of electrical traces) to be formed at the side faces of the solid array connector. The vias, as demonstrated in FIG. 4, further enhance the present invention over prior-art connectors, enabling interconnections between traces in adjacent layers of the connector and connections at the connector's top and bottom faces, which are parallel to the laminated layers. Embodiments of the invention may therefore be employed to interconnect up to six interconnect substrates for a hexahedral-shaped solid array connector.

An isometric view of another embodiment of the solid array connector according to the present invention is shown in FIG. 5 at 500. FIGS. 6 and 7 show cross-sectional views of connector 500 along the cross-section planes indicated in FIG. 5. Connector 500 comprises a body 114 of a rigid dielectric material comprising a plurality of laminated layers 115. Connector 500 has a top face 501, a bottom face 502, and four side faces 503–506. (The designations of top and bottom surface are not related to the orientation of the view shown in FIG. 5, but rather to the orientation of the layers 115 during the lamination process.)

As shown in FIGS. 6 and 7, connector 500 further comprises a plurality of electrical traces 108 distributed among layers 115, a plurality of contact bumps 512 formed at the ends of traces 108 at face 505, and a plurality of contact bumps 512' formed at the ends of traces 108 at face 506. Each trace 108 comprises an electrically conductive material, which comprises copper in one embodiment. Each of bumps 512 and 512' comprises an interior portion 513 and 513', respectively, and an outer layer 514 and 514', respectively, formed over the interior portion. Interior portions 513 and 513' each comprise a relatively rigid conductive material which adheres well to the ends of traces 108. In one embodiment of connector 500, portions 513 and 513' comprise copper. In preferred embodiments, bumps 512 and 512' have shapes of full spherical segments, with ratios of height to base diameter greater than 0.25. (A full spherical segment is defined to be the portion of a sphere bounded by a first plane intersecting the sphere and a second plane parallel to the first plane and tangent to the sphere, e.g., a plano-convex volume, or semi-hemispherical volume.) In a preferred embodiment, bumps 512 and 512' have substantially hemispherical shapes with height to base diameter ratios near 0.5.

Each of outer layers 514 and 514' preferably comprises a solder material and/or a conductive material which is pliable (e.g., soft gold). Pliable materials are employed when pressure contact is used to make connection to the bumps, and solder materials are employed when the bumps are soldered to corresponding pads or solder bumps on a substrate. In one embodiment, all the outer layers 514 at face 505 comprise pliable material for pressure contacts, and all the outer layers 514' at face 506 comprise a solder material. In other embodiments, both layers 514 and 514' comprise pliable materials, or both layers 514 and 514' comprise solder materials.

Connector 500 may further comprise angled traces 110 also having contact bumps 512 formed at their ends (FIG. 7). The angled traces enable electrical connections from side faces 505 and 506 to side faces 503 and 504. Connector 500 may also comprise vias 400 to enable connections at faces 501 and 502 (FIG. 4).

Multichip modules, PCB cards, PCB boards, or combinations thereof may be attached to connector 500 as required by the particular application of connector 500. These components may be attached by the above described means (e.g., screws 116, solder joints).

In one embodiment according to the present invention, dielectric body 114 is formed from a plurality of ~200 µm thick sheets (layers 115) of sapphire. Traces 108 and 110 are formed on layers 115 by etching trenches therein by standard photolithography and etching techniques. The trenches have typical widths of 10 µm, depths of 10 µm, spacing distances of 150 µm. Metal is formed in the trenches by sputtering a plating seed layer, removing the seed layer from all areas except the trenches with standard photolithography and etching steps, and electroless plating conductive material into the trenches. The plating metal preferably comprises copper, but may comprise other suitable materials, such as for example platinum, molybdenum, and tungsten. Other standard metalization techniques may be used, such as for example metalization lift-off, or electrolytic plating over a seed layer followed by subtractive etching.

After metalizing the trenches, the sheets (layers 115) are planarized by chemical/mechanical lapping. FIG. 8 shows a cross-sectional view of a sheet layer 115 after the completion of the lapping step. The sapphire sheets are laminated together at high temperature (e.g., 1,800° C.) in a hydrogen reducing atmosphere and then diced along planes which are substantially orthogonal to the layer surfaces.

With a layer thickness of ~200 µm and a trace spacing distance of ~150 µm, the density of interconnects for the above exemplary embodiment can be as high as ~3,800 per square centimeter. Minimum trace spacing distances of 50 µm are possible, enabling interconnect densities of up to 10,000 per square centimeter for this embodiment. These densities are much greater than the prior art densities of 30 to 60 per square centimeter.

With such small dimensions and close spacing of trace ends, it is difficult to form bumps 512 and 512' with standard photoresist and dry photosensitive film (e.g., Riston) application and lithographic exposure techniques. In order to define small features, the photoresist layer or dry film must have a uniform thickness which has a value close to the size of the smallest feature to be defined. Unfortunately, the photoresist processing equipment capable of forming thin uniform photoresist layers is designed for thin wafers, not solid array connectors, which may have shapes very different from thin wafers. Additionally, present dry films have thicknesses which are often too large to define small contact features. Moreover, the alignment of the exposure mask over the photoresist layer or dry film must be precise when small contact dimensions are desired. Unfortunately, the photolithographic equipment capable of such alignment is designed for thin wafers, not solid array connectors. Currently, alignment of exposure masks to photoresist layers or dry films must be done by relatively crude manual means. Other pattern transfer processes, such as sputter depositing through a pattern mask, suffer from the same alignment problem.

Accordingly, novel methods for forming bumps 512 and 512' without pattern transfer or photolithography are provided by the present invention. Interior portions 513 and 513' are formed by electroless plating of a relatively rigid conductive material, preferably copper, which forms interior portions 513 and 513' as bumps. Prior to plating, the trace ends may be suitably activated, such as for example by a palladium (Pd) catalyst for copper, as is well known in the plating art. Due to the nature of the plating process, interior portions 513 and 513' tend to grow uniformly in all directions (i.e., hemispherically) to a full-spherical-segment shape or hemispherical shape, with good adhesion between interior portions 513 and 513' and the trace ends. In one embodiment, interior portions 513 and 513' are formed with typical heights of 5 µm and diameters of 10 µm, and are formed on all desired faces at the same time.

Layers 514 and 514' are subsequently formed by electroless plating of a pliable material or a solder, or by dipping in a molten bath of solder, such as for example by wave soldering. When dipping is employed, the exposed surfaces of portions 513 and/or 513' are preferably first cleaned (e.g., by an acid dip) and coated with flux. In the case where the same pliable or solder material is used for layers 514 and 514', the layers may be formed simultaneously. Other faces of connector 500 may be masked to prevent formation of material on any trace ends present at these other faces. In one embodiment, soft gold is electroplated to form one or both of layers 514 and 514'. In other embodiments, solder is either electroplated or wave soldered to form one or both of layers 514 and 514'. Both the electro-plating process and the dipping process tend to form the outer layers uniformly over interior portions 513 and 513', typically providing bumps 512, 512' with full-spherical-segment shapes and/or hemispherical shapes.

When layers 514 and 514' comprise different materials, blanket masks may be selectively deposited to protect each face while the other face is being plated or dipped. For example, where different materials are to be electroplated for layers 514 and 514', a first face (either 505 or 506) is covered by a first mask and the second face is electroplated. The first mask is then removed, and a second mask is formed over the second face. The first face is then electroplated, followed by removing the second mask. These steps may be equally applied to the case where both faces are dipped in different materials, performing the dipping step in place of the plating step. Additionally, the masking steps may be used when one of the faces is electroplated while the other is dipped. For example, the first face is masked and the second face is dipped (or electroplated). The mask is then removed from the first face, and a second mask is formed over the second face. The first face is then electroplated (or dipped), followed by removing the second mask. The first and second masks may comprise appropriate solder masks, resists (including photoresists), or waxes, depending upon the process that the mask is protecting the face from.

In one embodiment, soft gold layers are plated one face to a typical thickness of approximately 20 μm, giving typical bump heights of ~25 μm, and solder layers are dipped to obtain a thickness of 1 μm to 2 μm. Alternatively, the solder is supplied by opposing solder bumps on an opposing interconnect substrate when the substrate is attached to the connector's face.

Bumps on other faces of connector 500 may be formed concurrently with the processing on faces 505 and 506 if the same material is being employed, or may be formed by separate masking and plating/dipping steps. In this regard, it may be useful to employ solders having different melting point temperatures so as to facilitate the disassembly of the interconnect substrates from connector 500, if necessary, as previously described.

After forming layers 514 and 514', interconnect substrates may be attached to connector 500 by pressure contacting or soldering. FIG. 9 shows a partial cross-sectional view of connector 500 opposite to an interconnect substrate 10 with two bumps 512 aligned in corresponding relationship to two pressure contact bumps 15 formed on the surface of substrate 10 prior to attachment by contact pressure. In this example, both contact bumps 15 and layers 514 comprise a pliable conductive material, such as for example, soft gold. FIG. 10 shows a partial cross-sectional view of connector 500, interconnect substrate 10, bumps 512, and contact bumps 15 after attachment. As indicated above, screws or other means may be used to urge substrate 10 towards connector 500. Due to the applied pressure, the shapes of contact bumps 15 and layers 514 are partially deformed. Depending upon the amount of applied pressure and the material used, some or nearly all of the deformation remains when substrate 10 is removed.

FIG. 11 shows a partial cross-sectional view of connector 500 opposite to an interconnect substrate 20 with two bumps 512 aligned in corresponding relationship to two solder bumps 25 prior to attachment. Solder bumps 25 are formed on corresponding pads 22 disposed on the surface of substrate 20. In this example, layers 514 comprise a solder material. FIG. 12 shows a partial cross-sectional view of connector 500, substrate 20, and bumps 512 after reflow attachment.

The present embodiments of this invention are to be considered in all respects as illustrative and not restrictive; the scope of the invention is to be indicated by the appended claims rather than the foregoing description. The invention can be practiced in many different embodiments and variations. For example, additional spacing layers could be silk-screened or glued to the surface of the dielectric to precisely place the interconnect substrates adjacent the solid array connector. All changes which come within the meaning and range of equivalency of the claims are intended to be incorporated within the scope of this invention.

What is claimed is:

1. A method of forming a connector comprising the steps of:

providing an electrically insulating dielectric body having a plurality of laminated dielectric layers, a first face, a second face, and a plurality of electrically conductive traces disposed through said body, each said trace comprising electrically conductive material formed within a trench on a surface of a dielectric layer and having a first end at said first face and a second end at said second face; and electroplating conductive material onto the trace ends at each of said first and second faces such that bumps are formed over said ends.

2. The method of claim 1 wherein said insulating dielectric body is formed by:

forming each trench within a respective dielectric layer;

stacking and laminating said dielectric layers together to form a block, and exposing the ends of said traces.

3. The method of claim 1 wherein said bumps are formed with a ratio of height to base diameter greater than 0.25.

4. The method of claim 1 wherein said bumps are formed with generally hemispherical shapes.

5. The method of claim 1 further comprising the step of electroplating onto the bumps at said first face a first layer of conductive material different from the conductive material of the bumps at said first face.

6. The method of claim 5 further comprising the step of electroplating onto the bumps at said second face a second layer of a conductive material different from the conductive material of the layer plated onto the bumps at said first face.

7. The method of claim 6 further comprising the step of forming a mask over said first face before electroplating said second layer of conductive material onto the bumps at said second face.

8. The method of claim 6 wherein one of the first and second layers comprises a conductive material which is more pliable than the conductive material of the other layer.

9. The method of claim 6 wherein one of the first and second layers comprises gold and the other layer comprises solder.

10. The method of claim 6 wherein said first layer comprises gold and said second layer comprises solder.

11. The method of claim 5 further comprising the step of forming a mask over said second face before electroplating said first layer of conductive material onto the bumps at said first face.

12. The method of claim 5 further comprising the step of forming a second layer of a solder material onto the bumps at said second face by dipping said bumps at said second face in a molten bath of said solder material.

13. The method of claim 1 further comprising the step of forming a first layer of a solder material onto the bumps at said first face by dipping said bumps at said first face in a molten bath of said solder material.

14. The method of claim 13 further comprising the step of electroplating onto the bumps at said second face a second layer of a conductive material.

15. The method of claim 14 wherein said first layer comprises solder and said second layer comprises gold.

16. The method of claim 1 further comprising the step of electroplating a layer of a pliable conductive material onto the bumps at said first and second faces, said pliable conductive material being more pliable than the conductive material of solid bumps.

17. The method of claim 16 wherein said pliable material comprises gold.

18. The method of claim 1 further comprising the step of forming a layer of a solder material onto the bumps at said first and second face by dipping said bumps in a molten bath of said solder material.

19. A method of forming a connector comprising the steps of:

providing an electrically insulating dielectric body having a plurality of laminated dielectric layers, a first face, a second face, and a plurality of conductive traces formed through said body, each said trace being formed on a dielectric layer and having a first end at said first face and a second end at said second face; and electroplating conductive material onto the trace ends at each of said first and second faces simultaneously by an electroless electroplating process such that bumps are formed over said ends.

20. The method of claim 19 further comprising the step of forming a layer of pliable conductive material on the bumps at each of said first and second faces, said pliable conductive material being more pliable than said bumps.

21. The method of claim 20 wherein said layers of pliable conductive material are formed by electroplating.

22. The method of claim 19 further comprising the step of forming a layer of a solder material on the bumps at each of said first and second faces.

23. The method of claim 22 wherein at least one of said layers of said solder material is formed on said bumps by dipping said bumps in a molten bath of said solder material.

24. The method of claim 19 further comprising the steps of forming a layer of pliable conductive material on the bumps at one of said first and second faces, said pliable conductive material being more pliable than said bumps, and of forming a layer of solder material on the bumps at the other of said first and second faces.

25. A method of forming connection bumps on a solid array connector having a first face, a second face, and a plurality of conductive traces through said connector, each trace having a first end at said first face and a second end at said second face, said method comprising the steps of:

electroplating a first conductive material onto the trace ends at each of said first and second faces such that bumps are formed over said ends;

thereafter forming a non-conductive mask over said second face to prevent conductive material from being electroplated onto the bumps at said second face; and thereafter electroplating a layer of a second conductive material onto the bumps at said first face, said second conductive material being different from said first conductive material.

26. The method of claim 25 further comprising the step of removing said mask and the step of thereafter electroplating a layer of a third conductive material onto the bumps at said second face, said third conductive material being different from said second conductive material.

27. The method of claim 26 wherein one of said second and third conductive materials is more pliable than the other.

28. The method of claim 26 wherein one of said second and third conductive materials comprises gold and wherein the other comprises solder.

29. A method of forming a connector comprising the steps of:

providing an electrically insulating dielectric body having a first face, a second face, and a plurality of electrically conductive traces formed through said body, each said trace having a first end at said first face and a second end at said second face, said insulating dielectric body comprising a laminated multilayer block and wherein a plurality of the layers in said block comprise trenches having electrically conductive material disposed therein to define said traces; and electroplating conductive material onto the trace ends at each of said first and second faces such that bumps are formed over said ends.

* * * * *

UNITED STATES PATENT AND TRADEMARK OFFICE
CERTIFICATE OF CORRECTION

PATENT NO. : 5,515,604
DATED : May 14, 1996
INVENTOR(S) : David A. Horine, *et al.*

It is certified that error appears in the above-indentified patent and that said Letters Patent is hereby corrected as shown below:

Column 5, line 52, delete "4" and insert therefor --104--.

Column 11, line 64, delete "formed" and insert therefor --disposed--.

Column 12, between lines 6 and 7, insert --filling each trench with electrically conductive material;--.

Signed and Sealed this

Fourth Day of February, 1997

Attest:

Attesting Officer

BRUCE LEHMAN

*Commissioner of Patents and Trademarks*